United States Patent [19]

Kaplow et al.

[11] 4,352,948
[45] Oct. 5, 1982

[54] HIGH-INTENSITY SOLID-STATE SOLAR-CELL DEVICE

[75] Inventors: Roy Kaplow, Newton; Robert I. Frank, Lexington; Joel Goodrich, Dracut, all of Mass.

[73] Assignee: Massachusetts Institute of Technology, Cambridge, Mass.

[21] Appl. No.: 209,942

[22] Filed: Nov. 17, 1980

Related U.S. Application Data

[63] Continuation of Ser. No. 73,281, Sep. 7, 1979, abandoned.

[51] Int. Cl.³ .............................................. H01L 31/06
[52] U.S. Cl. .................................... 136/249; 136/246; 136/255; 357/30
[58] Field of Search ............... 136/255, 249, 259, 246, 136/249 MS; 357/20, 30, 55, 65

[56] References Cited

U.S. PATENT DOCUMENTS

| | | | |
|---|---|---|---|
| 3,278,339 | 10/1966 | Gault | 136/255 |
| 3,969,746 | 7/1976 | Kendall | 357/30 |
| 3,985,579 | 10/1976 | Rahilly | 136/255 |
| 4,099,986 | 7/1978 | Diepers | 136/258 |
| 4,193,081 | 3/1980 | Kaplow et al. | 357/30 |

Primary Examiner—Aaron Weisstuch
Attorney, Agent, or Firm—Hopgood, Calimafde, Kalil, Blaustein & Judlowe

[57] ABSTRACT

The invention contemplates a solar-cell construction wherein plural spaced elongate unit cells of an array are formed from a parallel-grooved single wafer or body of substrate material of a first conductivity type, with adjacent sidewalls of adjacent units at each inter-unit groove formation. Both sidewalls at each of a succession of grooves are formed with regions of second conductivity type, and an electrically conductive coating lines each sidewall having a second conductivity type region. A first output-terminal interconnect extends along one margin of the body and has ohmic contact with the coatings of the sidewalls having regions of the second conductivity type. A second output-terminal connection has ohmic contact to the body in a surface region of first conductivity type. Various embodiments are disclosed.

25 Claims, 6 Drawing Figures

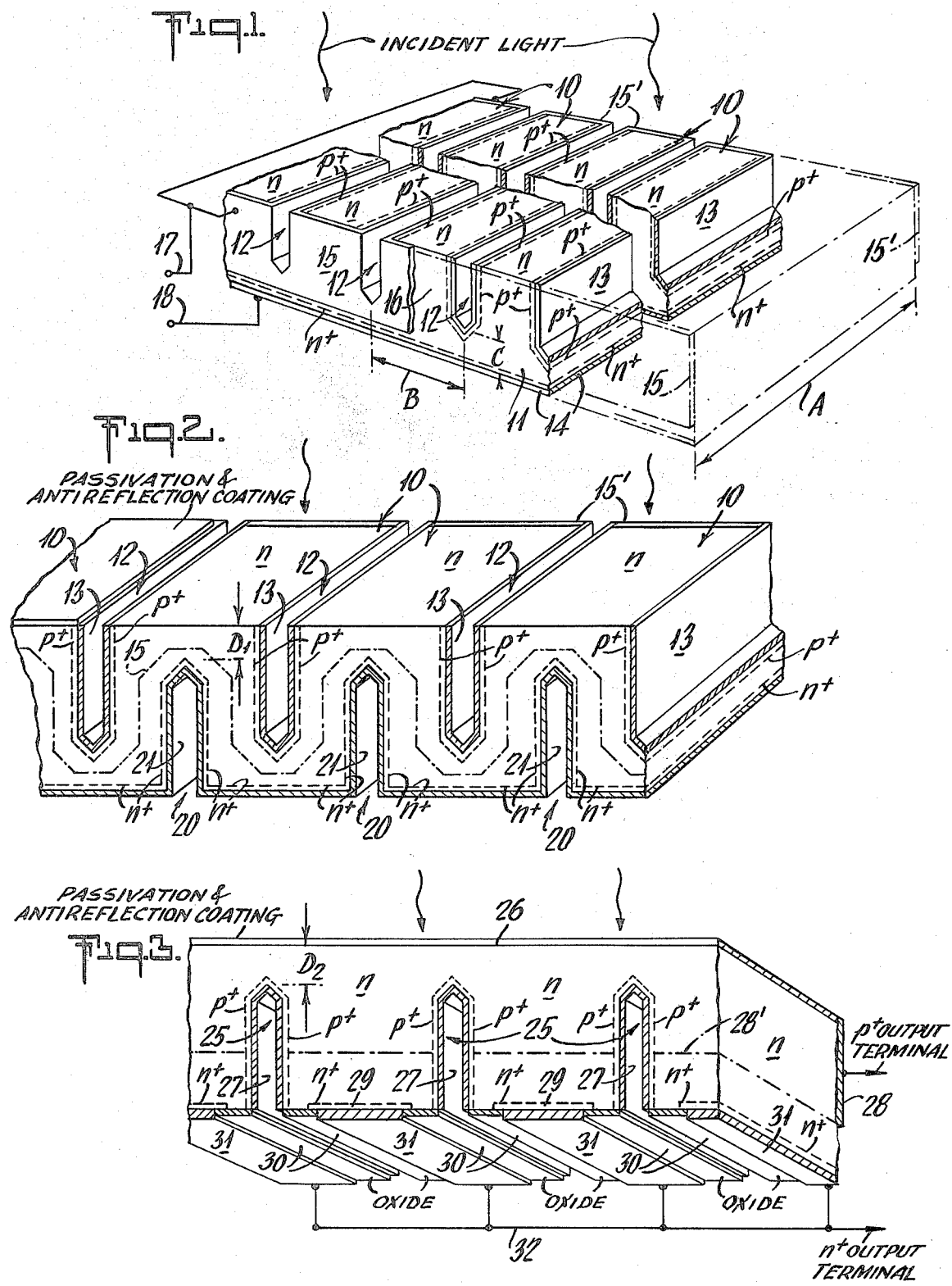

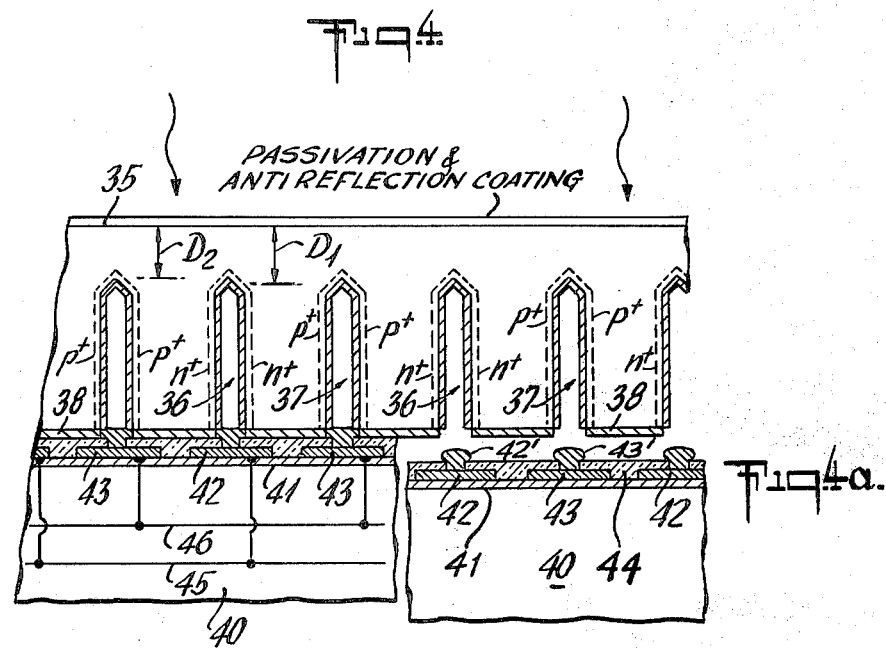
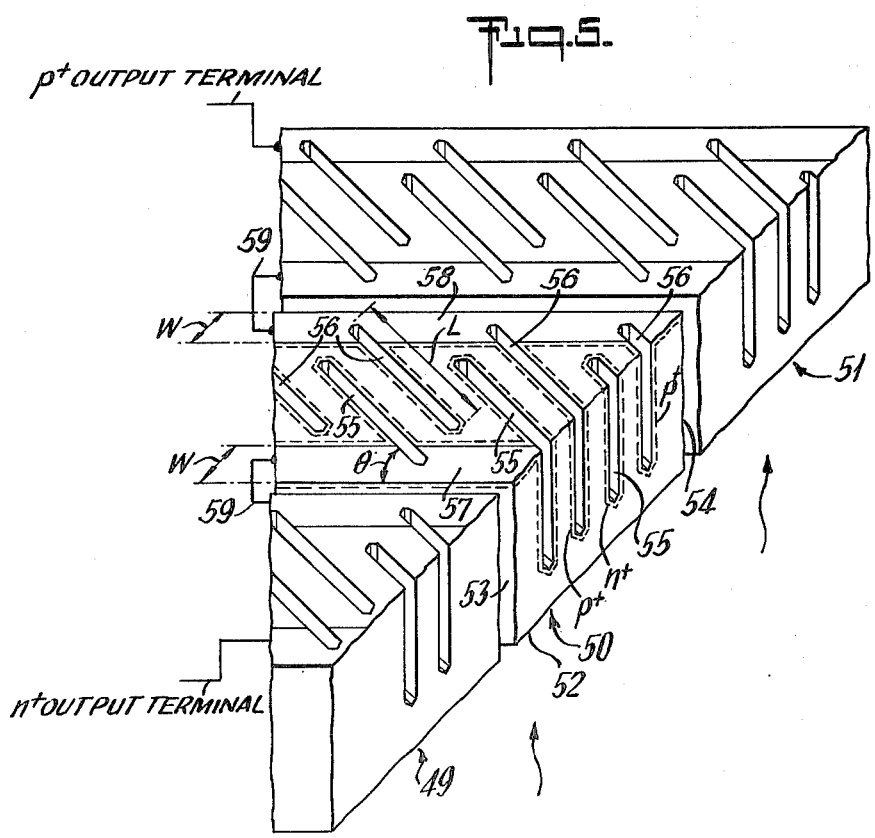

HIGH-INTENSITY SOLID-STATE SOLAR-CELL DEVICE

This application is a continuation of copending application Ser. No. 073,281, filed Sept. 7, 1979 abandoned.

BACKGROUND OF THE INVENTION

This invention relates to solar or photovoltaic cells, and more particularly to that variety of solar cell wherein a plurality of elongate and closely spaced cell units is formed as an array of such units, the formation being from the same single wafer of semiconductor substrate material.

The embodiments of the invention here described involve a solar cell which has an n-type silicon substrate. It is to be understood, however, that the solar cell of the invention may also be implemented with a substrate of p-type polarity, in which case the polarity of other regions of the cell would be reversed, with n replaced by p, n+ replaced by p+, and so on. It will also be understood that other types of semiconductor material may be employed and that a heterojunction, as well as the homojunction structure here described, may be employed.

The concept of a multiple-unit array of solar-cell units formed from the same single wafer of substrate material is disclosed in our U.S. Pat. No. 4,110,122, wherein the body material of each unit advantageously has the same positional relationship as existed in the original wafer; and methods of making such arrays are the subject of our U.S. Pat. No. 4,131,984. And in U.S. Pat. Nos. 4,128,732 and 4,129,458, there are disclosed various array structures of the single-wafer variety which seek to enhance the electrical output and efficiency of each unit (a) by presenting maximum exposure-surface area to incident high-intensity solar-radiation, (b) by minimizing the effective "dead space" area of those parts (e.g., gaps between units) of the overall exposure area, which "dead space" areas do not contribute to cell response, and (c) by so proportioning the cell geometry as to assure a predetermined short maximum carrier-travel distance to the nearest p-n junction, thereby creating carriers with a high probability of being collected. Further detail is also provided in our paper, entitled "Performance of a new high-intensity silicon solar cell", *Appl. Phys. Lett.*, Vol 34, No. 1, Jan. 1, 1979, pages 65–67. Disclosures of all the above-mentioned publications are hereby incorporated by reference.

In our U.S. Pat. No. 4,042,417, it is disclosed that cell response is optimal for incident radiation which is close to but offset from the p-n junction, but in said patent special lens elements were needed to concentrate the incident radiation within the desired region, i.e., close to but offset from the p-n junction, which region was 1 to 3 mils from the p-n junction for the silicon substrate there under consideration; the structures of said U.S. Pat. Nos. 4,128,732 and 4,129,458 make use of this optimal carrier-travel region with respect to the p-n junction, without requiring the special focusing lenses of said U.S. Pat. No. 4,042,417.

While all the single-wafer constructions of the above-identified publications rely upon micro-electronic manufacturing techniques such as anisotropic etching, and selective doping to form p+ and n+ regions, there are certain complicating manipulative factors which necessarily become significant in the relatively high cost to manufacture the same. There is still therefore a need for such a construction which not only makes use of the indicated optimum range of carrier-travel distance to the p-n junction plane and otherwise maximizes the exposure-surface area having high probability of carrier collection at the nearest p-n junction, but which also represents simplification of manufacture, with attendant reduction in cost.

BRIEF SUMMARY OF THE INVENTION

It is an object of the present invention to provide an improved multiple-unit array construction formed from a single piece of substrate material and wherein body material of individual units of the array remains in precisely the same positional relationship as in the original single piece of substrate material.

Another object is to meet the above object with a unit-cell and inter-cell geometry which lends itself to simplified manufacture, as compared with prior techniques.

It is also an object to meet the above objects with a unit-cell geometry which lends itself to relatively great probability of collection of carriers generated by high-intensity solar radiation, without requiring special focusing means unique to each unit of the array.

It is a specific object to meet the above objects with a structure wherein each cell unit has sidewall regions of opposite polarity and yet wherein any given pair of adjacent sidewalls of two adjacent cell units are necessarily of the same polarity.

Another specific object is to provide improved interconnect structure for the units of a solar-cell array, including provision for series and/or parallel combination of cell outputs.

A still further specific object is to provide such interconnect structure in the context of unfilled grooves which permit liquid-coolant circulation between units.

The foregoing and other objects and features of the invention are achieved by lining with conductive material various elongate grooves etched in a single wafer of first conductivity type material. At least one set of such grooves defines individual cell units, and the groove sidewalls of the set are formed with regions of second conductivity type, thereby establishing a vertical junction beneath the surface of each sidewall of the set. The conductive lining is as elongate as the grooves, and a single interconnect along one of the margins of the cell has permanent ohmic contact with adjacent ends of all liners of the grooves of the set, thereby establishing one terminal of a parallel connection of the individual cell units. Another single interconnect along a margin of the cell has permanent ohmic contact with first conductivity type material associated with the respective units.

DETAILED DESCRIPTION

The invention will be described in detail for various illustrative embodiment, in conjunction with the accompanying drawings in which:

FIG. 1 is an enlarged fragmentary and somewhat schematic perspective view of a single-wafer solar cell involving parallel-connected units of an array, representing a first embodiment of the invention;

FIGS. 2 and 3 are generally similar views to illustrate second and third embodiments;

FIG. 4 is a fragmentary vertical sectional view of a fourth embodiment, the left half of which is fully assembled and the right half of which is not completely assembled;

FIG. 4a is a fragmentary vertical sectional view of a base component of the embodiment of FIG. 4, shown poised in alignment for assembly to the right or unassembled half of FIG. 4; and FIG. 5 is a simplified fragmentary isometric diagram to illustrate a fifth embodiment wherein the electrical outputs of parallel-connected subarrays of cell units are combined in a series-connection of subarrays, the aspect being taken of the base or bottom surface, i.e., opposite the exposure surface of the cell.

The solar-cell array of FIG. 1 consists of a series of individual unit solar cells 10 each of which is formed from the same single wafer of semiconductor material, the units being connected in parallel to form a single array, or adaptable as one of a series of parallel-connected arrays of sub-units which are or may be later connected in series.

Each of the unit cells 10 is comprised of an n-type substrate 11. The units 10 are separated from one another by grooves or spaces 12, which are formed by anisotropic etching to create straight parallel walls extending from the upper surface of the wafer and through the substrate 11, to but short of the lower surface of the wafer. The grooves 12 extend the full longitudinal extent A of the cell array, and they repeat at equal lateral intervals B, in multiple, as determined by the overall lateral dimension of the array. The sidewalls of all grooves 12 (including the groove bottoms) are shown doped with second conductivity-type material to define p+ regions which are preferably coextensive with all groove confines, and the lower surface of the wafer is doped with higher impurity concentrations of first conductivity material to define n+ regions associated with each unit. A layer 13 of conductive material, such as plated or otherwise deposited metal, coats all p+ regions and thus lines each of the grooves 12; and a single conductive layer or plate 14, which may be similarly deposited metal, costs the entire n+ region, i.e., the bottom surface of the wafer.

For p+ interconnect purposes, a single elongate bus plate or conductive strip 15, which may also be similarly deposited metal, extends continuously along one of the array margins which intersects all corresponding ends of the liners of grooves 12. In the course of its deposition, plate 15 intimately bonds to all liners 13 and is preferably isolated from end areas 16 of the units 10 by reason of protective oxide coating on such end areas, the designation 16 being understood to identify such oxide coating. The bus plate 15 conforms to its intercepts with successive grooves 12, thus leaving open the ends of all grooves for unimpeded coolant-flow access. As shown, the groove bottoms are at offset C from the bottom surface of the wafer, and the bus plate 15 extends within the offset C but short of the bottom surface of the wafer, to provide continuous integrity of p+ interconnect conductivity. Even greater assurance of p+ interconnect integrity is provided by a second and similar bus 15' at the opposite longitudinal ends of units 10. The cell array is completed by p+ terminal lead connection 17 to the interconnects 15-15' and by n+ terminal lead 18 connection to the bottom plate 14. And a passivation and anti-reflective coating (not shown) will be understood to be preferred over all the remainder of the upper surface of the wafer, i.e., at the upper or exposure surface of each unit 10 of the array, the direction of light incidence on the exposure surface being indicated by legend.

Typically, and with a single crystal silicon wafer as the starting substrate material, 0.008 to 0.010-inch thick, the grooves 12 may be etched with 0.0004-inch width and at uniform spacing up to 0.010 inch, being preferably substantially 0.006 inch center-to-center. Groove etching may be to 0.006 inch depth, leaving the offset C at 0.002 to 0.004 inch for ample accommodation of the busses 15-15'.

The grooves 12 thus are characterized by a high aspect ratio, in that groove depth very substantially exceeds groove width; groove depth is also substantially greater than half the substrate thickness, and less than 10% of the effective cell-unit width. The depth of p+ diffusions is not critical, but these diffusions are uniform and relatively shallow (e.g., about $2\mu$) into the groove surfaces, and the conductive linings 13, illustratively successive plates of nickel and gold, are similarly thin (e.g. 1–2 $\mu$m), leaving substantially 0.0004-inch wide grooves for coolant accommodation. Unit width is thus effectively 0.0056 inch, and approximately 93 percent of the cell-array area presented to the incident light is utilized with optimal provision for minority carrier collection at junction planes. Measured efficiency for a 1-cm square cell constructed to such dimensions is approximately 20 percent at 100 suns, and rises with increased concentration of the incident light.

FIG. 2 illustrates a modification wherein an additional set of vertical grooves 20 is etched from the back surface of the starting wafer, in lateral interlace with the p+-diffused grooves 12 of an array which may be otherwise as described for FIG. 1 and which therefore bears the same reference numbers for corresponding parts. The back grooves 20 have been n+ layered and are shown to be contiguous with the n+ layer on the back or bottom surface of the original wafer. The back grooves 20 are also conductively coated at 21, for example, with the same nickel-gold application as described at 13 for grooves 12, the bottom or n+ bus 14 being thereby rendered conductively continuous, via the metal-clad surfaces of grooves 20. The phantom line 15 in FIG. 2 will be understood to designate the lower profile of the p+ bus platings which interconnect the platings 13 at the respective ends of grooves 12.

The grooves 20 of the modification of FIG. 2 will be seen not to significantly affect the effective area of the cell, in that (a) they may be at sufficient offset $D_1$ (for example, about 0.003 inch, for the specifications illustratively stated for FIG. 1) and (b) the surfaces of grooves 20 perform a reflecting function in aid of cell response. The FIG. 2 modification is readily incorporated into the procedure for FIG. 1 manufacture, and some advantage for FIG. 2 is seen by reason of an enhanced back-surface field effect, yielding an increased open-circuit voltage $V_{oc}$.

For high-intensity exposure conditions, as contemplated for the cells of our invention, structural design is strongly influenced by cooling considerations. A reason for etching grooves in the front or upper surface, as in FIGS. 1 and 2 is to allow the back of the cell (i.e., plate 14) to be soldered directly to a cooling plate or the like; in addition, certain processing steps are thereby simplified.

A more advanced embodiment, which allows full utilization of the exposure surface, is shown in FIG. 3. In this arrangement, the p+-doped grooves 25 in the single wafer substrate have been etched from the back surface of the wafer, with groove-width and spacing dimensions which may be as described for FIG. 1.

However, the depth of grooves 25 is greater, being preferably to an extent having 0.001 to 0.002-inch offset $D_2$ from the exposure surface 26. Again, all surfaces of grooves 25 are p+ layered and are metal-plated (27) and are interconnected by the described end-bus technique, one such bus 28 being shown at the distant end of grooves 25 and with a lower profile, suggested at 28', between grooves 25. Masking techniques are employed to establish elongate n+ regions 29 in the bottom surface and at lateral offset from nearby p+ regions. Strips 30 of oxide coating lap adjacent limits of p+ and n+ regions and assure their electrical insulation at the bottom surface, and elongate plated metal strips 31 between oxide coatings 30 establish ohmic contact with the n+ regions. The structure is completed by passivation and anti-reflection coating of the exposure surface and by making bus interconnection of the n+ conductors. The latter is suggested schematically at 32 and will be understood to be provided by a cooling plate or the like, should the strips 31 be mounted as by soldering to such a plate.

The embodiment of FIGS. 4 and 4a illustrates a cell array formed from a single wafer wherein a continuous exposure surface 35 is presented to incident radiation and in which n+-doped grooves 36 and p+-doped grooves 37 are etched from the back surface in interlaced succession, at lateral spacings and widths which may be as described in connection with FIG. 2. The depth of the grooves 37 which are p+-doped is preferably to the extent which is at the described offset $D_2$ from the upper surface 35, and the depth of the n+ grooves 36 is preferably to the extent of the slightly greater offset $D_1$. An oxide coating 38 along remaining areas of the bottom surface provides electrical insulation between limits of adjacent n+ and p+ regions at the bottom surface, and all surfaces of all grooves 36-37 are preferably metal-plated, so that bottom edges of all such platings are exposed between the oxide-coated regions 38.

The foregoing description for FIG. 4 accounts for a basic cell construction or subassembly which may be completed by a first longitudinal-end bus which is electrically connected to adjacent ends of groove-36 liners (to the exclusion of groove 37 liners) and by a second opposite-end bus which is electrically connected to adjacent ends of groove-37 liners (to the exclusion of groove-16 liners). However, in the form shown, construction is completed by addition of a second subassembly, shown separately in FIG. 4a. This second subassembly is shown to comprise a suitable substrate 40 having an insulating upper surface, which may be an oxide layer or coating 41. Elongate conductor strips 42-43 as of plated metal are applied to layer 41 in spaced parallel relation such as to provide registering overlap with the open ends of successive grooves 36-37. Upstanding ribs 42'-43' of metal are bonded to or otherwise form part of the strips 42-43 and are preferably initially solder-dipped or otherwise solder-coated to present the bulbous sectional appearance shown in FIG. 4a, a filling 44 of insulating material, such as an oxide, being applied between ribs 42'-43' and over the remaining areas of strips 42-43. The width of ribs 42'-43' substantially coincides with the gaps between successive oxide coatings 38.

The subassembly of FIG. 4a is applied to the open-groove bottom of the described cell subassembly of FIG. 4, with ribs 42'-43' inserted via gaps in coatings 38 and into contact with the plated open ends of grooves 36-37, respectively. Application of heat melts the solder and closes the bottoms of all grooves, with longitudinally continuous electrical contact to the strips 42-43, which thereby become n+ and p+ connection strips, respectively, the assembly then having the appearance of the left half of FIG. 4. Bussed interconnection of strips 42 may be a plated layer 45 at one longitudinal end of substrate 40, and similarly bussed interconnection of strips 43 may be a plated layer 46 at the other longitudinal end of substrate 40, all as suggested schematically in FIG. 4. The completed article is seen to provide a monolithic structure with all interconnects and with groove passages for leak-proof accommodation of liquid coolant circulation, of the character discussed at greater length in our pending application Ser. No. 889,952, filed Mar. 24, 1978, now U.S. Pat. No. 4,193,081.

The embodiment of FIG. 5 is illustrative of a further technique of providing electrically parallel bussed interconnection of the p+ and n+ poles of multiple units in each of a plurality of like subarrays 49-50-51, with ready series-connectability of the subarrays. For simplicity, the subarray 50 can be taken as representative, and the viewing aspect has been selected to show bottom-surface detail. Basically, the subarray 50 is formed by etching from the back surface of a single wafer to groove depths short of the opposite or exposure surface 52 of the wafer, in much the same manner as described for the grooved subassembly of FIG. 4. However, in FIG. 5, the crystal orientation and masking of the wafer are selected such that the etching process proceeds normal to the wafer surface and at a consistent angular orientation $\theta$, such as 45 degrees, with respect to the opposite lateral sides 53-54 of the subarray. Further in FIG. 5, the grooves are each of the same finite length L which terminates short of the nearby sides 53-54, and there is a first series of grooves 55 which extends closer to one side (53) than to the other (54) in staggered interlace with a second series of grooves 56 which extends closer to said other side (54) than to said one side (53). The first-series grooves 55 are shown characterized by n+ doping and will be understood to be thus doped and conductively coated over all surfaces and portions of grooves 55, as in the manner already discussed for other embodiments. The lateral margin of the back surface, viz. the margin at side 53, is also n+-doped, to a lateral extent W sufficient for substantial contiguous formation with the interception of the ends of grooves 55 to the exclusion of the corresponding ends of grooves 56, and a single conductive coating or plate 57 over this n+-doped margin provides the n+ bus of the subarray. In similar fashion, the opposite lateral margin of the back surface, viz. the margin at side 54 is p+-doped, to the same lateral extent W sufficient for substantial contiguous formation with and interception of the ends of p+-doped grooves 56 to the exclusion of the corresponding ends of the n+ grooves 55, and a single conductive coating or plate 58 over this p+-doped margin provides the p+ bus of the array, it being understood that the p+ grooves 56 are also conductively clad and electrically conductively integral with the p+ bus 58. Although not shown, the back surface, i.e., between grooves 55-56 and between bus plates 57-58, will be understood to be oxide-coated for surface insulation between otherwise exposed doped regions, and a passivation and anti-reflection coating will be understood to be applied to the entire front surface 52.

In FIG. 5, the selected break for a fragmentary showing is made in a generally vertical plane, extending from the lower left to the upper right of the diagram. This happens to produce a sectional cut of the subarray 50 bearing close resemblance to the grooved subassembly of FIG. 4. In fact, the groove width, spacing and depth specifications applicable to FIG. 4 will be understood to be equally applicable to FIG. 5, when the depicted section is taken normal to the elongation direction of the grooves.

The foregoing description as to subarray 50 will not only be understood to be applicable to all other subarrays 49–51, but these other subarrays will be understood to be preferably formed, along with subarray 50, from the same single wafer of initial substrate, the sides 53–54 being but sidewalls of etched dividing grooves between subarrays. The series-interconnection of subarrays is schematically suggested at 59, between adjacent busses of adjacent subarrays, and output terminals are identified by legend. Preferably, the positional relation of subarray substrate material remains the same, as between subarrays 49-50-51, as in the original wafer from which they are all formed. Techniques for such retention are discussed in our U.S. Pat. No. 4,131,984 in context of retaining the position of units which are severed in an array, but these techniques will be understood also to be applicable to retention of severed subarrays which cooperate, as here, in an array of subarrays.

The described embodiments will be seen to represent substantial improvement in solar-cell array construction wherein multiple units are formed from a single wafer substrate. These embodiments permit use of plating techniques to provide utmost integrity of ohmic connection to p+ and n+ regions, and provision of bus bar interconnects which do not diminish the utilizable area of the exposure face or utmost cooling efficacy of groove formations. Moreover, the full effective exposure area provides a desired maximum distance in the order of 3 mils to the nearest p-n junction, for all points on the exposure surface.

While the invention has been described in detail for the preferred forms shown, it will be understood that modifications may be made without departure from the claimed scope of the invention.

What is claimed is:

1. A vertical-junction semi-conductor solar cell, comprising a body of substrate material of a first conductivity type and having spaced parallel upper and lower surfaces, the upper one of said surfaces having a plurality of laterally spaced parallel elongate grooves to a depth more than half the body thickness and therefore close to but short of the other of said surfaces, thereby defining an integrally connected series of otherwise spaced, elongate, parallel units with upstanding sidewalls at said grooves, said grooves extending fully to and therefore open at both of the marginal edge surfaces of said body, each sidewall of the grooves of said plurality comprised of an independent localized region of a second conductivity type, each localized region of second conductivity type being exclusive to the sidewalls of its particular groove and independent of the sidewalls of any other groove, whereby a corresponding plurality of independent vertical junctions characterize said body, a separate electrically conductive metal coating bonded to and fully lining both sidewalls of each of the grooves of said plurality and having ohmic contact with the second conductivity type regions of both of the sidewalls of each said groove, first output-terminal means including a first electrically conductive metal interconnect plate bonded to and extending along one of the marginal edge surfaces and having bonded ohmic contact with the full marginal-edge inercept of each of the metal coatings of the grooves of said plurality, said first output-terminal means including a second electrically conductive metal interconnect plate bonded to and extending along the other marginal edge surface and having bonded ohmic contact with the full marginal-edge intercept of each of the metal coatings of the grooves of said plurality, and second output-terminal means including an electrically conductive metal plate having ohmic contact to said body in a lower surface region of first conductivity type.

2. The solar cell of claim 1, in which said marginal edge surface interconnect plates are bonded to said body to a depth exceeding the depth of said grooves, whereby the grooved body is strengthened at groove intercepts with said marginal edge surfaces.

3. A semiconductor solar cell, comprising a body of substrate material of a first conductivity type and having spaced parallel upper and lower surfaces, one of said surfaces having a plurality of laterally spaced parallel elongate grooves to a depth close to but short of the other of said surface, thereby defining an integrally connected series of otherwise spaced, elongate, parallel units with upstanding sidewalls at said grooves, each sidewall of the grooves of said plurality comprised of a localized region of a second conductivity type, a first electrically conductive metal coating lining both sidewalls of each of the grooves of said plurality and having ohmic contact with the second conductivity type region of both of the sidewalls of each said groove, a second plurality of laterally spaced parallel elongate grooves in said body at one of said surfaces and laterally interlaced with respect to the grooves of said first-mentioned plurality, the grooves of said second plurality extending to a depth close to but short of the opposite surface and in at least partial depth overlap with the grooves of said first mentioned plurality, thereby defining further upstanding sidewalls at the grooves of said second plurality, each sidewall of the grooves of said second plurality comprised of a localized region of higher impurity concentration of first conductivity-type material, an electrically conductive metal coating lining both sidewalls of each of the grooves of said second plurality and having ohmic contact with the higher-impurity concentration regions of both of the sidewalls of the grooves of said second plurality, first output-terminal means including a first electrically conductive metal interconnect extending along one of the margins of said body and having ohmic contact with the coatings of the grooves of said first plurality, and second output-terminal means including a second electrically conductive metal interconnect extending along another of the margins of said body and having ohmic contact with the coatings of the grooves of said second plurality.

4. The solar cell of claim 3, in which the grooves of said first plurality are open at one of said surfaces, and in which the grooves of said second plurality are open at the other of said surfaces.

5. The solar cell of claim 3, in which the grooves of both said pluralities are open at the same one of said surfaces.

6. The solar cell of claim 5, in which one of said surfaces is adapted for exposure to incident radiation, and in which said grooves are open at the surface opposed to the exposure surface.

7. The solar cell of claim 6, in which the grooves of said pluralities are of finite length such as to terminate short of both lateral limits of said body, the grooves of said first plurality terminating closer to one than the other of said limits and the grooves of said second plurality terminating closer to said other than to said one of said limits, said conductive interconnects being on the surface opposed to the exposure surface and each of said interconnects being of a width and on an alignment which intersects the corresponding ends of the grooves of a different one of said pluralities.

8. The solar cell of claim 7, in which said grooved body is one of a plurality of cell subarrays all of which are formed from the same single piece of substrate material, and series interconnection between adjacent output-terminal means of the respective subarrays.

9. The solar cell of claim 6, in which said body is of rectangular planform, and in which the alignments of said grooves are at an angle less than a right angle to the body margin which the groove alignment intersects.

10. The solar cell of claim 9, in which said angle is approximately 45 degrees.

11. The solar cell of claim 2, in which one of said surfaces is adapted for exposure to incident radiation, and in which said grooves are open at the exposure surface.

12. The solar cell of claim 5, in which said first conductive interconnect extends along one lateral margin of said body and said second conductive interconnect extends along the opposite lateral margin of said body.

13. The solar cell of claim 3, in which the regions of second conductivity type are substantially coextensive with the grooves of said first plurality.

14. The solar cell of claim 3, in which the regions of higher impurity concentration are substantially coextensive with the grooves of said second plurality.

15. The solar cell of claim 3, in which said grooves are characterized by an aspect ratio such that groove depth substantially exceeds groove width, whereby (a) unit exposure-surface area and (b) current-handling capability may both be maximized.

16. The solar cell of claim 15, in which the grooves of one of said pluralities are open to the upper surface and are of width less than 10% of cell exposed width at said upper surface.

17. A semiconductor solar cell, comprising a body of substrate material of a first conductivity type and having spaced parallel upper and lower surfaces, a plurality of laterally spaced parallel elongate grooves in the lower one of said surfaces to a depth close to but short of the upper one of said surfaces, each sidewall of the grooves of said plurality comprised of a region of second conductivity type, a metal coating intimately bonded to the sidewalls of each groove and in ohmic contact with said region, the metal coatings being sufficiently thin to leave the grooves otherwise substantially open, and first output-terminal means including for each groove an elongate metal groove-closing element continuously contacting the associated groove sidewalls at substantially only the vicinity of said lower surface and thereby converting each groove to an elongate passage for coolant flow while at the same time completing ohmic contact to the coating of each said groove.

18. The solar cell of claim 17, in which said grooves are of a first series and in which a similar series of grooves in said lower surface is in interlace with the grooves of said first series, each sidewall of the second-series grooves comprised of a region of higher-impurity concentration of first conductivity material, a metal coating intimately bonded to the sidewalls of each second-series groove and in ohmic contact with said last-defined region, the second-mentioned coatings being sufficiently thin to leave the second-series grooves otherwise substantially open, and second output-terminal means including for each groove an elongate metal groove-closing element continuously contacting the associated groove sidewalls at substantially only the vicinity of said lower surface and thereby converting each second-series groove to an elongate passage for coolant flow while at the same time completing ohmic contact to the coating of each second-series groove.

19. The solar cell of claim 18, in which the elongate metal elements of said first and second output-terminal means are mounted as a subassembly to a single substrate, said latter substrate being assembled to said body to complete said metal element contacts with said sidewalls.

20. A semiconductor solar cell comprising a body of substrate material of a first conductivity type and having spaced parallel exposure and base surfaces, a first plurality of laterally spaced elongate grooves in said base surface and in laterally spaced interlace relation with a second plurality of similarly spaced elongate grooves in said base surface, the grooves of both pluralities extending to depths close to but short of said exposure surface, each sidewall of the grooves of said first plurality comprised of a region of second conductivity type and each sidewall of the grooves of said second plurality comprised of a region of higher-impurity concentration of first conductivity material, a separate metal coating intimately bonded to the sidewalls of each groove and in ohmic contact with the conductivity-type region associated therewith, a first output-terminal means including an elongate metal element bonded to said base surface and having electrical contact exclusively with the metal coatings of said first plurality of grooves at first corresponding longitudinal ends thereof, and second output-terminal means including an elongate metal element bonded to said base surface and having electrical contact exclusively with the metal coatings of said second plurality of grooves at second corresponding longitudinal ends thereof.

21. A semiconductor solar cell, comprising a body of substrate material of a first conductivity type and having spaced parallel upper and lower surfaces, one of said surfaces having a plurality of laterally spaced parallel elongate grooves to a depth close to but short of the other of said surfaces, thereby defining an integrally connected series of otherwise spaced, elongate, parallel units with upstanding sidewalls at said grooves, each sidewall of the grooves of said plurality comprised of a localized region of a second conductivity type, a first electrically conductive metal coating lining both sidewalls of each of the grooves of said plurality and having ohmic contact with the second conductivity type region of both of the sidewalls of each said groove, a second plurality of laterally spaced parallel elongate grooves in said body at one of said surfaces and laterally interlaced with respect to the grooves of said first-mentioned plurality, the grooves of said second plurality extending to a depth close to but short of the opposite surface and in at least partial depth overlap with the grooves of said first mentioned plurality, thereby defining upstanding sidewalls at the grooves of said second plurality, each sidewall of the grooves of said second plurality comprised of a localized region of higher impurity concentration of first conductivity-type material, an electrically conductive metal coating lining both sidewalls of each of the grooves of said second plurality and having ohmic contact with the higher-impurity concentration regions of both of the sidewalls of the grooves of said second plurality, first electrically conductive metal interconnect means having ohmic contact with the coatings of the grooves of said first plurality, said second electrically conductive metal interconnect means having ohmic contact with the coatings of the grooves of said second plurality.

22. A vertical-junction semiconductor solar cell, comprising a body of substrate material of a first conductivity type and having spaced parallel upper and lower surfaces, the upper surface being adapted for exposure to receive incident radiation, the lower surface having a plurality of laterally spaced parallel elongate grooves to a depth close to but short of said exposure surface, thereby defining an integrally connected series of otherwise spaced, elongate, parallel units with upstanding sidewalls at said grooves, each sidewall of the grooves of said plurality comprised of an independent localized region of a second conductivity type, each localized region of second conductivity type being exclusive to the sidewalls of its particular groove and independent of the sidewalls of any other groove, whereby the lower surface of each unit between adjacent grooves is of first conductivity type; first output-terminal means including a first plurality of separate electrically conductive plates each of which lines both sidewalls of a different groove of said plurality and has ohmic contact with the second conductivity type regions of both of the sidewalls of its associated groove, said first output-terminal means including an electrically conductive metal interconnect extending along one of the margins of said body and having ohmic contact with the separate plates of said plurality; and second output-terminal means including a second plurality of separate electrically conductive metal plates each of which is in ohmic contact with first conductivity type material at the lower surface of a different unit and between adjacent grooves, said second output-terminal means including an electrically conductive metal interconnect having ohmic contact with the separate plates of said second plurality.

23. The solar cell of claim 22, in which each of the plates of said second plurality is a coating upon the lower surface of a different unit.

24. The solar cell of claim 22, in which the lower surface of said body has a second plurality of grooves between those of said first plurality, there being first conductivity type material at the sidewalls of the grooves of said second plurality, and in which each of the plates of said second plurality includes a coating upon the sidewalls of a different one of the grooves of said second plurality.

25. The solar cell of claim 22, in which said body has a region of higher-impurity concentration in first conductivity type material at each ohmic contact with a different one of the metal plates of said second plurality.

* * * * *